(12) United States Patent
Baba et al.

(10) Patent No.: US 10,288,895 B2
(45) Date of Patent: May 14, 2019

(54) OPTICAL DEVICE AND OPTICAL APPARATUS

(71) Applicant: TOYODA GOSEI CO., LTD., Kiyosu-shi (JP)

(72) Inventors: Kazumasa Baba, Kiyosu (JP); Hiromitsu Takeuchi, Kiyosu (JP); Yuji Yonehara, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 1 day.

(21) Appl. No.: 15/631,756

(22) Filed: Jun. 23, 2017

(65) Prior Publication Data

US 2017/0371175 A1    Dec. 28, 2017

(30) Foreign Application Priority Data

Jun. 27, 2016  (JP) ................................. 2016-126657

(51) Int. Cl.

| G02B 27/48 | (2006.01) |
| G02B 7/02 | (2006.01) |
| G02B 7/00 | (2006.01) |
| G02B 5/30 | (2006.01) |
| H01L 41/09 | (2006.01) |
| H02N 2/10 | (2006.01) |
| H01L 41/04 | (2006.01) |

(52) U.S. Cl.
CPC ........... *G02B 27/48* (2013.01); *G02B 5/3083* (2013.01); *G02B 7/00* (2013.01); *H01L 41/094* (2013.01); *H02N 2/10* (2013.01); *H01L 41/04* (2013.01)

(58) Field of Classification Search
CPC . G02B 7/00; G02B 7/02; G02B 7/023; G02B 7/028; G02B 7/18; G02B 7/1805; G02B 7/181; G02B 7/182; G02B 7/1821; G02B 7/198; G02B 27/48; G02B 27/64; G02B 27/646
See application file for complete search history.

(56) References Cited

U.S. PATENT DOCUMENTS

| 8,791,623 | B2 * | 7/2014 | Tani .................... | G02B 26/0858 310/323.02 |
| 2002/0121843 | A1 * | 9/2002 | Takeuchi ........... | G02B 26/0858 310/330 |
| 2005/0110873 | A1 * | 5/2005 | Enomoto ............. | G02B 27/646 348/207.99 |
| 2009/0039734 | A1 * | 2/2009 | Takahashi ............ | H02N 2/0025 310/323.02 |
| 2009/0072664 | A1 * | 3/2009 | Nagata ................. | H02N 2/0085 310/323.02 |
| 2016/0238834 | A1 * | 8/2016 | Erlich .................. | G02B 26/085 |
| 2017/0371174 | A1 * | 12/2017 | Baba ..................... | G02B 27/48 |

FOREIGN PATENT DOCUMENTS

JP         2015-138083 A      7/2015

* cited by examiner

*Primary Examiner* — Thong Q Nguyen
(74) *Attorney, Agent, or Firm* — McGinn I.P. Law Group, PLLC.

(57) ABSTRACT

An optical device includes: an optical element; a housing unit configured to accommodate the optical element; a support part configured to pivotally support the optical element to be tiltable with respect to the housing unit; a piezoelectric element configured to connect the optical element and the housing unit to each other; and an electrode arranged at the piezoelectric element.

17 Claims, 3 Drawing Sheets

OPTICAL DEVICE AND OPTICAL APPARATUS

CROSS-REFERENCE TO RELATED APPLICATION(S)

This application is based upon and claims the benefit of priority from Japanese Patent Application No. 2016-126657, filed on Jun. 27, 2016, the entire contents of which are incorporated herein by reference.

BACKGROUND

1. Field of the Invention

The present disclosure relates to an optical device and an optical apparatus including the same.

2. Description of the Related Art

In an optical apparatus that displays an image on a screen by using laser light as a light source, it is known that speckles (flickering or glittering of light irregularly occurring) occur on the screen due to coherence of the light. Such speckles reduce display quality and visibility.

JP-A-2015-138083 discloses an optical device for removing speckles. The optical device of JP-A-2015-138083 includes an optical element (a diffusion plate) and a driving mechanism for operating the optical element, wherein the optical element arranged on an optical path of laser light is displaced by the driving mechanism, so that the coherence of the laser light is suppressed to remove the speckles.

In the optical device of JP-A-2015-138083, a piezoelectric element made of an electroactive polymer material is used as the driving mechanism. The driving mechanism using the piezoelectric element extends and contracts the piezoelectric element based on application of a voltage, thereby displacing the optical element by force generated by the extension and contraction operation.

JP-A-2015-138083 specifically discloses that the driving mechanism using the piezoelectric element displaces the optical element to be vibrated or rotated on a plane along the piezoelectric element. However, JP-A-2015-138083 does not disclose a detailed configuration in which, when the optical device is arranged on an optical axis of laser light and is used, the optical element is displaced in a direction for changing an inclination angle with respect to the optical axis. In relation to this point, since force generated by the extension and contraction operation of the piezoelectric element is very small as compared with a driving mechanism such as a motor, when the piezoelectric element is used, it is difficult to generate a tilting motion for lifting a part of the optical element.

SUMMARY

The invention has been made to solve the above-described problem, and an object of the present invention is to provide an optical device capable of displacing an optical element in a direction for changing an inclination angle with respect to an optical axis with a simple configuration by using a piezoelectric element, and an optical apparatus including the optical device.

In order to attain the object, an optical device according to an aspect of the invention includes: an optical element; a housing unit configured to accommodate the optical element; a support part configured to pivotally support the optical element to be tiltable with respect to the housing unit; a piezoelectric element configured to connect the optical element and the housing unit to each other; and an electrode arranged at the piezoelectric element.

According to the aforementioned configuration, the support part that pivotally supports the optical element to be tiltable is provided, so that possible displacement of the optical element is limited to only tilting based on the support part. Therefore, even though stress generated by the extension and contraction of the piezoelectric element and acting on the optical element is small, the support part (the shaft line) functions as a fulcrum, so that the optical element can be easily tilted. Consequently, when the optical device is arranged to be used on the optical axis of laser light, the optical element can be displaced with a simple configuration in the direction for changing an inclination angle with respect to the optical axis.

In the optical device, preferably, the piezoelectric element has a sheet shape.

The aforementioned optical device can tilt the optical element with small force, so that a sheet-like piezoelectric element can be used as the piezoelectric element. When the sheet-like piezoelectric element is used, it is possible to miniaturize the optical device.

In the optical device, preferably, the piezoelectric element has a restriction part at a position, which is adjacent to a side of the housing unit at which the electrode is arranged, whereby extension and contraction of the piezoelectric element are restricted.

In this case, when a voltage is applied to the electrode, the extension of the piezoelectric element toward the housing unit side is restricted, but the piezoelectric element is largely extended toward the optical element side in proportion thereto. In this way, it is possible to allow larger force to act on the optical element.

In the optical device, preferably, a shaft line serving as a tilting center when the optical element is tilted and a fixed part of the optical element with respect to the piezoelectric element are configured to be shifted from each other in a thickness direction of the optical element.

In this case, when a voltage is applied, force in the linear direction acting on the optical element from the piezoelectric element is easily converted to force in the rotation direction in which the optical element is tilted.

According to another aspect of the invention, there is provided an optical apparatus in which the optical device according to the above is arranged in a plural number on an optical axis of laser light.

Even in the aforementioned optical device in which the displacement of the optical element is limited to only tilting, the optical apparatus is configured that laser light passes through the plurality of optical devices, and thus it is possible to variously move the laser light.

According to the optical device and the optical apparatus of the present invention, it is possible to displace an optical element in a direction for changing an inclination angle with respect to an optical axis with a simple configuration.

BRIEF DESCRIPTION OF THE DRAWINGS

The present invention will become more fully understood from the detailed description given hereinbelow and the accompanying drawing which is given by way of illustration only, and thus is not limitative of the present invention and wherein:]

DETAILED DESCRIPTION OF THE INVENTION

Hereinafter, an embodiment of the present invention will be described.

Figure 1:
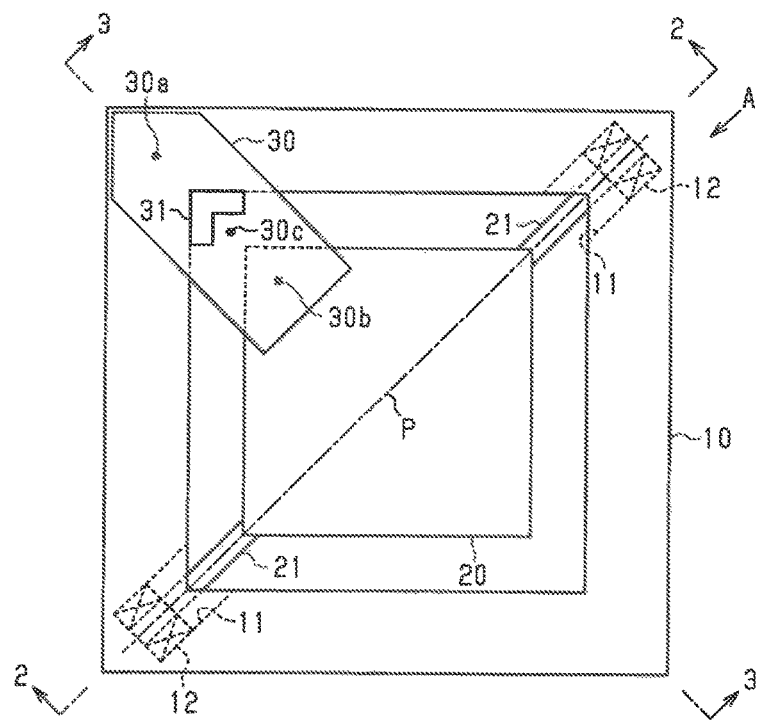
FIG. 1 is a plan view of an optical device.
Figure 2:
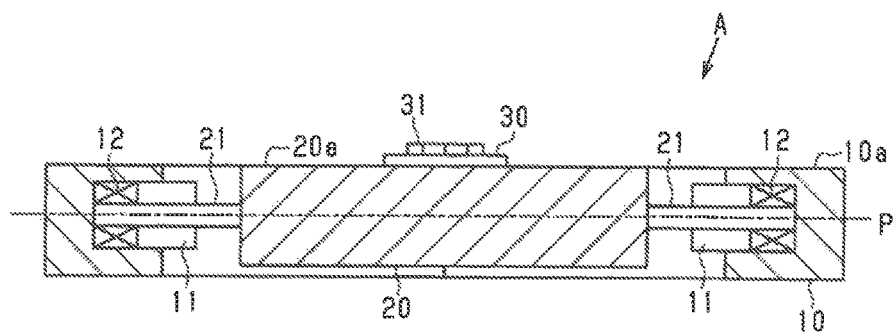
FIG. 2 is a sectional view taken along line 2-2 of FIG. 1.
Figure 3:
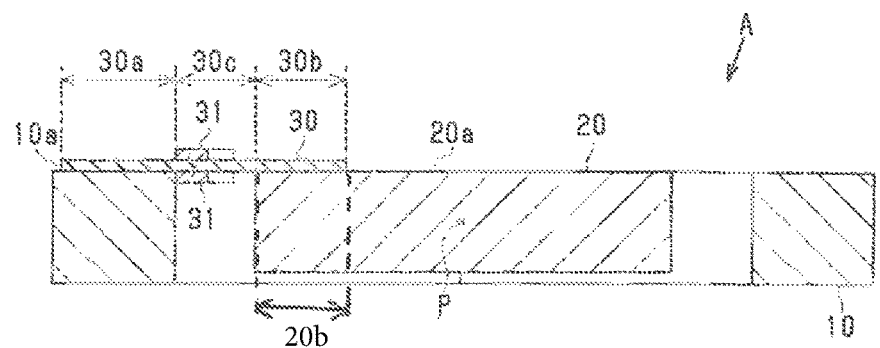
FIG. 3 is a sectional view taken along line 3-3 of FIG. 1.

As illustrated in FIGS. 1 to 3, an optical device A includes a housing unit 10 having a rectangular frame shape. At two corner parts diagonally positioned in the housing unit 10, concave parts 11 opened to an inner peripheral surface side are respectively formed. In each concave part 11, a bearing 12 is fixed.

Inside the housing unit 10, an optical element 20 having a rectangular plate shape is arranged. At two corner parts diagonally positioned in the optical element, shafts 21 are provided to extend on a diagonal line interconnecting the two corner parts from a center part in a thickness direction thereof. Each shaft 21 is rotatably and pivotally supported to each bearing 12 fixed to each corner part of the housing unit 10. Consequently, the optical element 20 is configured to be rotatably movable around a shaft line P of the shaft 21 based on the shaft 21 and the bearing 12.

As the shaft 21, a member serving as a rigid body, for example, a hard resin pin or metal pin can be preferably used. A fixing structure of the shaft 21 with respect to the optical element 20 is not specifically limited; however, for example, it is possible to employ a fitting structure in which the shaft 21 is fitted into a concave part provided in the optical element 20 or a welding structure in which the shaft 21 is welded to the optical element 20. In the present embodiment, the bearing 12 and the shaft 21 constitute a support part that pivotally supports the optical element 20 to be tiltable with respect to the housing unit 10.

As the optical element 20, a well-known optical element used to reduce speckles can be used. As a specific example of the optical element 20, it is possible to employ an optical element having a structure in which wavelength plates of λ/4 to λ/2 are formed with a fine structure on the surfaces of areas obtained by dividing a light transmitting area through which light passes, the surfaces being formed with a checkerboard pattern or a honeycomb pattern having a predetermined length and optical axis directions of light randomly differ in each divided area. Furthermore, as a material of the optical element 20, for example, it is possible to employ a dielectric material made of synthetic silica, optical glass, plastic and the like or a light transmitting material.

As illustrated in FIGS. 1 and 3, the optical device A includes a piezoelectric element 30 that connects the housing unit 10 and the optical element 20 to each other. The piezoelectric element 30 is a member that is extended and contracted along the planar direction thereof based on application of a voltage, wherein in the present embodiment, a sheet-like piezoelectric element having an approximately rectangular shape in a plan view is used. The piezoelectric element 30 is arranged across the housing unit 10 and the optical element 20 at one side of the optical element 20 employing the shaft line P as a boundary in the plan view.

Specifically, the piezoelectric element 30 is arranged across one of the two corner parts provided with no concave part 11 in the housing unit 10 and the corner part of the optical element 20 adjacent to the one of the to corner parts.

A lower surface side of an end portion of one side of the piezoelectric element 30 is adhered to an upper surface 10a of the housing unit 10 and a lower surface side of an end portion of the other side of the piezoelectric element 30 is adhered to an upper surface 20a of the optical element 20 (the upper surface 10a of the housing unit 10 and the upper surface 20a of the optical element 20 are names conveniently used in order to facilitate understanding and do not specify an installation direction of the optical device A). The piezoelectric element 30 is adhered to the housing unit 10 and the optical element 20 in a state having no looseness.

As the piezoelectric element 30, it is possible to use a well-known piezoelectric element, for example, a piezoelectric element made of an electroactive polymer material such as a dielectric elastomer, an electrostrictive relaxor ferroelectric polymer, a piezoelectric polymer, a ferroelectric polymer, an electrostatic shrinkage polymer, a liquid crystal polymer, an ionic polymer metal composite, a mechanochemical polymer, a mechanochemical gel, an ion-exchange resin membrane-metal complex, and a polymer carbon nanotube.

As illustrated in FIGS. 1 and 3, the piezoelectric element 30 is provided on the upper surface and the lower surface thereof with a pair of electrodes 31 for interposing the piezoelectric element 30 therebetween in the thickness direction thereof. In the plan view, the piezoelectric element 30 has a first fixed part 30a adhered to the housing unit 10, a second fixed part 30b adhered to the optical element 20, and a non-fixed part 30c not adhered to the housing unit 10 and the optical element 20. The electrode 31 is formed in an L shape in the plan view and is arranged along the boundary with the first fixed part 30a in the non-fixed part 30c of the piezoelectric element 30.

The optical device A can be applied as parts for reducing speckles in a well-known optical apparatus using laser light. As the aforementioned optical apparatus, for example, it is possible to employ a projector, a laser printer, an exposure device, an optical fiber amplifier, a spectrometer, a laser measuring device, an optical pickup device, an optical exposure device, an optical measuring instrument, a polarization analyzer, a polarization mode dispersion compensation system, a CCD sensor, a CMOS sensor, a phase difference measuring device, a laser machining device, a medical device, a micromachine, a HUD (Head Up Display) for vehicles, a lighting system, and a 3DH display device.

Figure 4:
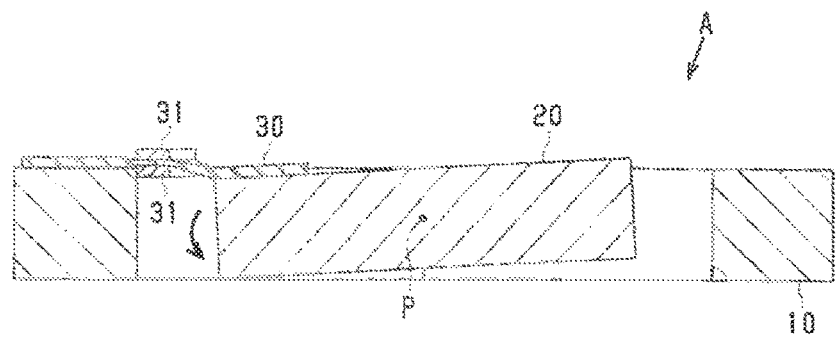
FIG. 4 is a sectional view illustrating a state in which an optical element is tilted.

Next, based on FIGS. 3 and 4, operations of the present embodiment will described.

When a voltage is applied between the electrodes 31, the piezoelectric element 30 is contracted at the part interposed between the electrodes 31, so that the peripheral portion of the part interposed between the electrodes 31 in the non-fixed part 30c is extended. Since the first fixed part 30a and the second fixed part 30b of the piezoelectric element 30 are adhered to the housing unit 10 and the optical element 20 and their positions with respect to the housing unit 10 and the optical element 20 are fixed, the first fixed part 30a and the second fixed part 30b are not extended.

The non-fixed part 30c of the piezoelectric element 30 is extended, so that bending occurs in the non-fixed part 30c and thus stress due to the bending acts on the part of the optical element 20, which is adhered to the piezoelectric element 30. As a consequence, as illustrated in FIG. 4, the optical element 20 is tilted to remove the aforementioned bending by employing the part of the optical element 20, which is adhered to the piezoelectric element 30, as a force point and employing the shaft line P of the shaft 21 as a fulcrum. Consequently, the optical device A of the present embodiment is arranged to be used on the optical axis of laser light such that the laser light is incident into the optical element 20 in the direction (for example, the vertical direction in FIGS. 3 and 4) perpendicular to the shaft line P, so that it is possible to displace the optical element 20 in the direction for changing an inclination angle with respect to the optical axis.

Next, effects of the present embodiment will be described.

(1) The optical device A includes the optical element 20, the housing unit 10 that accommodates the optical element 20, the support part (the bearing 12 and the shaft 21) that pivotally supports the optical element 20 to be tiltable with respect to the housing unit 10, the piezoelectric element 30 that connects the optical element 20 and the housing unit 10 to each other, and the electrodes 31 arranged at the piezoelectric element 30.

According to the aforementioned configuration, the support part that pivotally supports the optical element 20 to be tiltable is provided, so that possible displacement of the optical element 20 is limited to only tilting based on the support part. Therefore, even though stress generated by the extension and contraction of the piezoelectric element 30 and acting on the optical element 20 is small, the shaft line P of the support part functions as a fulcrum, so that the optical element 20 can be easily tilted. Consequently, when the optical device A is arranged to be used on the optical axis of laser light, the optical element 20 can be displaced with a simple configuration in the direction for changing an inclination angle with respect to the optical axis.

The optical element 20 is displaced in the direction for changing the inclination angle with respect to the optical axis, so that an excellent speckle reduction effect is obtained as compared with the case in which the optical element 20 is displaced on a predetermined plane. Furthermore, an effect for removing a diffraction fringe is also obtained.

(2) Furthermore, the displacement of the optical element 20 is limited to only tilting based on the support part. Therefore, even when a voltage with the same magnitude is applied to the piezoelectric element 30, it rarely occurs that the displacement direction and displacement amount of the optical element 20 are changed due to various factors. In addition, in the aforementioned configuration in which the optical element 20 is held by the support part made of a rigid body, it rarely occurs that the posture of the optical element 20 is changed by an influence of gravity acting on the optical element 20, as compared with a configuration in which the optical element 20 is held by a soft piezoelectric element. Consequently, it is possible to more precisely control the displacement of the optical element 20.

(3) The piezoelectric element 30 has a sheet shape.

As described above, the optical device A can tilt the optical element 20 with small force, so that a sheet-like piezoelectric element can be used as the piezoelectric element 30. When the sheet-like piezoelectric element 30 is used, it is possible to miniaturize the optical device A.

(4) The piezoelectric element 30 as the first fixed part 30a (a restriction part) adhered to the housing unit 10 at a position, which is adjacent to the housing unit 10 side at which the electrode 31 is arranged, whereby extension and contraction of the piezoelectric element 30 are restricted.

According to the aforementioned configuration, when a voltage is applied to the electrode 31, the extension of the piezoelectric element 30 toward the housing unit 10 side is restricted, but the piezoelectric element 30 is largely extended toward the optical element 20 side in proportion thereto. In this way, it is possible to allow larger force to act on the optical element 20. As a consequence, it is possible to increase the maximum displacement amount (the maximum variation angle) of the optical element 20 and to reduce a voltage required in order to obtain a specific displacement amount.

As illustrated in FIG. 3, the shaft line P when the optical element 20 rotates and a fixed part 20b of the optical element 20 with respect to the piezoelectric element 30 are configured to be shifted from each other in the thickness direction (the vertical direction in FIG. 3) of the optical element 20.

According to the aforementioned configuration, when a voltage is applied, force in the linear direction acting on the optical element 20 from the piezoelectric element 30 is easily converted to force in the rotation direction in which the optical element 20 is tilted. As a consequence, it is possible to increase the maximum displacement amount (the maximum variation angle) of the optical element 20 and to reduce a voltage required in order to obtain a specific displacement amount.

(6) In relation to the optical element 20, the shaft line P is employed as a line along a diagonal line connecting a diagonal position of one side and the piezoelectric element 30 is adhered to a corner part positioned at a diagonal position of the other side. That is, a fixed part of the optical element 20 with respect to the piezoelectric element 30 is provided at the remotest position from the shaft line P.

According to the aforementioned configuration, a distance between a force point (the fixed part of the optical element 20 with respect to the piezoelectric element 30) when the optical element 20 is tilted and a fulcrum (the shaft line P) becomes long. In this way, it is possible to reduce force required in order to tilt the optical element 20.

The present embodiment can also be modified and embodied as follows.

The shape of the housing unit 10 is not limited to the configuration of the aforementioned embodiment, and may be other shapes such as a polyangular frame shape other than an annular shape and a rectangle.

The external appearance of the optical element 20 is not limited to the configuration of the aforementioned embodiment, and may be other shapes such as a polyangular shape other than an annular shape, an oval shape, and a rectangle. Furthermore, it is sufficient if the external appearance of the optical element 20 is a shape tiltably accommodated inside of the housing unit 10. For example, the inner peripheral shape of the housing unit 10 and the external appearance of the optical element 20 may be different from each other (may not be similar to each other).

In the aforementioned embodiment, as the support part, the bearing 12 and the shaft 21 are provided; it however, the configuration of the support part is not specifically limited if the support part pivotally supports the optical element 20 to be tiltable with respect to the housing unit 10. For example, it may be possible to employ a support part having a configuration in which the bearing 12 and the shaft 21 on one side are omitted, thereby supporting the optical element 20 in the form of a cantilever. Furthermore, it may be possible to employ a support part having a configuration in which an arc-like groove portion is provided at one side of the housing unit 10 and the optical element 20 and a protruding portion insertable into the groove portion is provided at the other side to enable the protruding portion to move in the groove portion, so that the optical element 20 rotates with respect to the housing unit 10.

Figure 5:
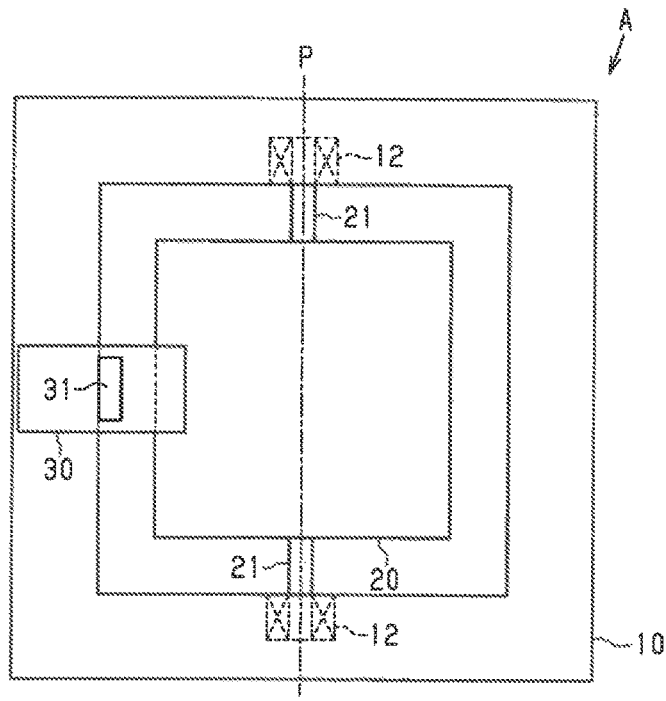
FIG. 5 is a plan view of an optical device of a modification example.

The position of the support part (the position of the shaft line P) for the optical element 20 may be changed. For example, as illustrated in FIG. 5, the support part may be provided such that the shaft line P becomes a line extending along the side of the optical element 20. Furthermore, the support part may be provided such that the shaft line P becomes a line not passing through the center (the center of gravity) of the optical element 20, that is, the shaft line P eccentric from the center (the center of gravity) of the optical element 20.

In the aforementioned embodiment, the planar shape of the piezoelectric element 30 is an approximately rectangular shape; however, the planar shape of the piezoelectric element 30 is not specifically limited if it is a shape arrangeable across the housing unit 10 and the optical element 20.

The arrangement of the piezoelectric element 30 with respect to the optical element 20 may be changed. For example, as illustrated in FIG. 5, the piezoelectric element 30 may be arranged at a position across the center part of the side of the optical element 20 and the housing unit 10. Furthermore, the piezoelectric element 30 may be arranged such that the shah line P when the optical element 20 rotates and a fixed part of the optical element 20 with respect to the piezoelectric element 30 coincide with each other in the thickness direction of the optical element 20.

The piezoelectric element 30 for connecting the housing unit 10 to the optical element 20 may be provided in a plural number. For example, the piezoelectric element 30 may be further provided at a position illustrated in FIG. 5 with respect to the optical device A illustrated in FIG. 1. When a plurality of piezoelectric elements 30 are provided, the electrodes 31 are provided to each piezoelectric element 30. Furthermore, when a plurality of piezoelectric elements 30 are provided, a voltage application timing to each piezoelectric element 30 and the magnitude of a voltage to be applied are adjusted, so that it is possible to more precisely control the displacement of the optical element 20.

Furthermore, the piezoelectric element 30 can also be provided at both sides interposing the shaft line P. In this case, preferably, the piezoelectric element 30, which is provided at an opposite side while the shaft line P is being interposed, is provided to be adhered to the housing unit 10 and the optical element 20 on the lower surface of the housing unit 10 and the lower surface of the optical element 20.

The fixing method of the piezoelectric element 30 with respect to the housing unit 10 and the optical element 20 is not limited to the adhesion. For example, the housing unit 10 is made up of two members obtained by dividing the housing unit 10 in the thickness direction thereof and the piezoelectric element 30 is interposed between the two members, so that the piezoelectric element 30 may be fixed to the housing unit 10.

The shape and arrangement of the electrode 31 are not specifically limited if the electrode 31 is arranged at the non-fixed part 30c of the piezoelectric element 30.

A plurality of (a plurality of pairs of) electrodes 31 capable of independently applying a voltage may be provided to one piezoelectric element 30. In this case, a voltage application timing to each electrode and the magnitude of a voltage to be applied are adjusted, so that it is possible to more precisely control the displacement of the optical element 20.

Figure 6:
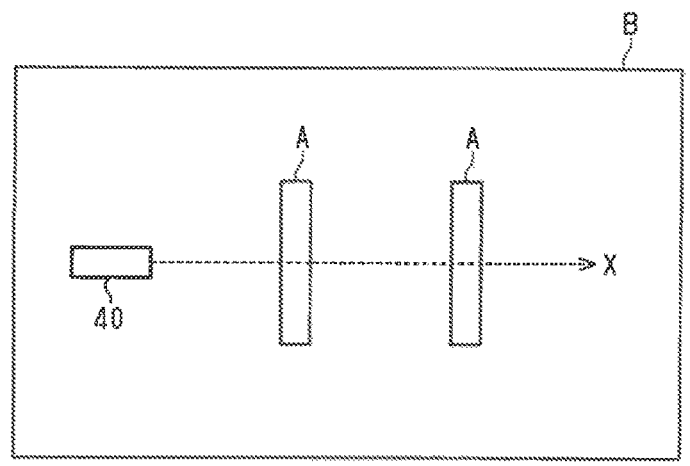
FIG. 6 is a schematic view of an optical apparatus.

As illustrated in FIG. 6, in an optical apparatus B in which the optical device A is employed as parts for reducing speckles, a plurality of optical devices A are preferably arranged on the optical axis X of laser light which is output from a light source 40.

In this case, even in the optical device A in which the displacement of the optical element 20 is limited to only tilting, the optical apparatus B is configured that laser light passes through the plurality of optical devices A, and thus it is possible to variously move the laser light.

What is claimed is:

1. An optical device comprising:
   an optical element;
   a housing unit configured to accommodate the optical element;
   a support part configured to pivotally support the optical element to be tiltable with respect to the housing unit, the support part including:
      a shaft provided on the optical element; and
      a bearing, provided on the housing, configured to pivotally support the shaft;
   a piezoelectric element configured to connect the optical element and the housing unit to each other; and
   an electrode arranged at the piezoelectric element.

2. The optical device according to claim 1, wherein the piezoelectric element has a sheet shape.

3. The optical device according to claim 1, wherein the piezoelectric element has a restriction part at a position, which is adjacent to a side of the housing unit at which the electrode is arranged, whereby extension and contraction of the piezoelectric element are restricted.

4. The optical device according to claim 1, wherein a shaft line as a rotational axis serving as a tilting center when the optical element is tilted and a fixed part of the optical element with respect to the piezoelectric element are configured to be shifted from each other in a thickness direction of the optical element.

5. The optical device according to claim 1, wherein a gap is provided between the housing unit and the optical element.

6. The optical device according to claim 1, wherein a gap is provided between the housing unit and the optical element such that the housing unit does not contact the optical element.

7. The optical device according to claim 1, wherein the piezoelectric element is attached fixedly to the housing unit and the optical element at a part of the optical element separate from where the support part pivotally supports the optical element.

8. The optical device according to claim 1, wherein the support part pivotally supports the optical element via a side surface of the optical element.

9. The optical device according to claim 1, wherein the piezoelectric element is attached to a top surface of the optical element, and
   wherein the support part pivotally supports the optical element via a side surface of the optical element.

10. The optical device according to claim 9, wherein the side surface of the optical element is perpendicular to the top surface of the optical element.

11. The optical device according to claim 1, wherein the part of the optical element that the piezoelectric element is attached does not overlap with where the support part pivotally supports the optical element.

12. The optical device according to claim 1, wherein the optical element comprises a rectangular shape,
   wherein the piezoelectric element is attached to a first corner of the rectangular shape of the optical element, and
   wherein the support part pivotally supports the optical element at a side surface of the rectangular shape of the optical element at a second corner.

13. The optical device according to claim 12, wherein the piezoelectric element is attached to a top surface of the optical element.

14. The optical device according to claim 12, wherein the first corner and the second corner are adjacent to each other.

15. The optical device according to claim 1, wherein the piezoelectric element is configured to connect the optical element and the housing unit to each other by being attached to a part of the optical element and a part of the housing unit.

16. An optical apparatus comprising:
   a plurality of optical devices, each of which includes:
      an optical element;
      a housing unit configured to accommodate the optical element;
      a support part configured to pivotally support the optical element to be tiltable with respect to the housing unit, the support part including:
      a shaft provided on the optical element; and
      a bearing, provided on the housing, configured to pivotally support the shaft;
      a piezoelectric element configured to connect the optical element and the housing unit to each other; and
      an electrode arranged at the piezoelectric element,
   wherein the plurality of optical devices are arranged on an optical axis of laser light.

17. The optical apparatus according to claim 16, wherein the piezoelectric element is configured to connect the optical element and the housing unit to each other by being attached to a part of the optical element and a part of the housing unit.

* * * * *